United States Patent
Cho

(10) Patent No.: US 7,095,668 B2
(45) Date of Patent: Aug. 22, 2006

(54) MAIN AMPLIFIER AND SEMICONDUCTOR DEVICE

(75) Inventor: Yong Deok Cho, Gyunggi-Do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 20 days.

(21) Appl. No.: 11/032,381

(22) Filed: Jan. 10, 2005

(65) Prior Publication Data

US 2006/0023536 A1     Feb. 2, 2006

(30) Foreign Application Priority Data

Jul. 27, 2004   (KR) ...................... 10-2004-0058803

(51) Int. Cl.
  *G11C 7/02*  (2006.01)
(52) U.S. Cl. ................... 365/207; 365/205; 365/203
(58) Field of Classification Search ................ 365/207, 365/205, 203, 230.03
  See application file for complete search history.

(56) References Cited

U.S. PATENT DOCUMENTS

| | | | | |
|---|---|---|---|---|
| 4,777,625 A | * | 10/1988 | Sakui et al. ................ | 365/207 |
| 5,274,598 A | * | 12/1993 | Fujii et al. .................. | 365/205 |
| 5,648,928 A | * | 7/1997 | Yoon et al. .................. | 365/63 |
| 6,084,809 A | | 7/2000 | Wada | |
| 6,104,655 A | * | 8/2000 | Tanoi et al. ................ | 365/205 |
| 6,175,516 B1 | | 1/2001 | Kitsukawa et al. | |

* cited by examiner

*Primary Examiner*—Anh Phung
(74) *Attorney, Agent, or Firm*—Marshall, Gerstein & Borun LLP

(57) ABSTRACT

Disclosed are a main amplifier and a semiconductor device employing the main amplifier. The main amplifier is arranged between a plurality of pairs of local input/output lines and a global input/output line. The main amplifier comprises a main amplifier pre-charge unit for pre-charging the main amplifier in response to inputted pre-charge control signals; an input/output sense amplifier enabled by enable signals for sensing a first data signal transmitted from the plurality of pairs of input/output lines of a plurality of memory banks, amplifying the sensed first data signal, and outputting the amplified first data signal as a second data signal of a first potential level; and an input/output driver for pull-down or pull-up driving the global input/output line in response to the second data signal from the input/output sense amplifier. The main amplifier is connected in common to the plurality of pairs of local input/output lines for taking charge of the plurality of memory banks.

12 Claims, 5 Drawing Sheets

MAIN AMPLIFIER AND SEMICONDUCTOR DEVICE

This application relies for priority upon Korean Patent Application No. 2004-58803 filed on Jul. 27, 2004, the contents of which are herein incorporated by reference in their entirety.

BACKGROUND OF THE INVENTION

1. Field of the Invention

The present invention relates to a main amplifier and a semiconductor device including the same, and more particularly to a main amplifier and a semiconductor device including the same, which is capable of significantly reducing the number of main amplifiers for amplifying data signals from local input/output lines and outputting the amplified data signals to global input/output lines, for miniaturization and high integration of semiconductor memory devices.

2. Description of the Related Art

Dynamic random access memory (DRAM) is a volatile memory device for storing data in cells each including one transistor and one capacitor. A data input/output operation, which is a basic function of a DRAM cell, is conducted by an on/off operation of a word line, which is a gate input of a transistor in a cell.

FIG. 1 shows the internal configuration related to data input/output operation in a semiconductor device. As shown in FIG. 1, a memory cell in a general DRAM device includes a plurality of memory banks. A read operation for data stored in each cell in a cell matrix MAT of each memory bank BANK0, BANK1, BANK2 and BANK3 is conducted when cell data amplified by sense amplifiers in a sense amplifier array SA is loaded on respective local input/output lines connected to the sense amplifiers, amplified by main amplifiers MA0, MA1, MA2 and MA3, and transmitted to a DQ block through global input/output lines gio0, gio1, . . .

FIG. 1 shows an x8 device having 8 input/output lines as an example of a semiconductor device. Each memory bank BANK0, . . . , BANK3 requires 8 main amplifiers MA. Thus, four memory banks require a total of 32 main amplifiers.

Accordingly, the minimal number of main amplifiers required for the conventional DRAM device corresponds to the multiplication of the number of memory banks by the number of input/output lines. Accordingly, in the case of a graphic memory using an x16 device having 16 input/output lines or a x32 device having 32 input/output lines, at least 64 or 128 main amplifiers are required for four memory banks.

Accordingly, since the memory device having the configuration as described above requires a number of main amplifiers, there is a problem in that a large area for peripheral devices except for the memory cells is required. This problem becomes substantial in DRAM having multi-bank or multi-input/output line structure. In addition, due to this problem, the conventional semiconductor device also has a problem in that it is difficult to set layout pitches of sense amplifiers of a memory code and the like properly.

SUMMARY OF THE INVENTION

Therefore, it is an object of the present invention to provide a main amplifier and a semiconductor device including the same, which is capable of significantly reducing the number of main amplifiers for amplifying data signals from local input/output lines and outputting the amplified data signals to global input/output lines, for miniaturization and high integration of semiconductor memory devices, and, particularly, eliminating restrictive factors related to layout pitches in a memory having a multi local input/output line structure.

In accordance with an aspect of the present invention, the above and other objects can be accomplished by the provision of a main amplifier arranged between a plurality of pairs of local input/output lines and a global input/output line, comprising: a main amplifier pre-charge unit for pre-charging the main amplifier in response to inputted pre-charge control signals; an input/output sense amplifier enabled by enable signals for sensing a first data signal transmitted from the plurality of pairs of input/output lines of a plurality of memory banks, amplifying the sensed first data signal, and outputting the amplified first data signal as a second data signal of a first potential level; and an input/output driver for pull-down or pull-up driving the global input/output line in response to the second data signal from the input/output sense amplifier, wherein the main amplifier is connected in common to the plurality of pairs of local input/output lines for taking charge of the plurality of memory banks.

In accordance with another aspect of the present invention, the above and other objects can be accomplished by the provision of a semiconductor device comprising: a plurality of memory banks each including a plurality of cell matrixes and a plurality of sense amplifier arrays; a plurality of local input/output line pre-charge units for pre-charging a plurality of pairs of local input/output lines of the plurality of memory banks; and a plurality of main amplifiers for amplifying data signals from respective pairs of local input/output lines and outputting the amplified data signals to a plurality of global input/output lines, wherein each of the plurality of main amplifiers comprises: a main amplifier pre-charge unit for pre-charging the main amplifier in response to inputted pre-charge control signals; an input/output sense amplifier enabled by enable signals for sensing a first data signal transmitted from respective pairs of input/output lines of respective memory banks, amplifying the sensed first data signal, and outputting the amplified first data signal as a second data signal of a first potential level; and an input/output driver for full-down or full-up driving respective global input/output lines in response to the second data signal from the input/output sense amplifier, and wherein the main amplifier is connected in common to a plurality of pairs of local input/output lines for taking charge of a plurality of memory banks.

Preferably, the main amplifier further comprises a main amplifier isolation unit for isolating the plurality of memory banks from the main amplifier in response to a main amplifier isolation signal.

Preferably, the main amplifier further comprises an inverter pre-driver for inverting or non-inverting the second data signal from the input/output sense amplifier and providing the inverted or non-inverted second data signal to the input/output driver.

Preferably, the input/output sense amplifier includes two pull-up driving devices and two pull-down driving devices, which are cross-coupled.

Preferably, the plurality of memory banks is two memory banks, which are symmetrically opposite to each other.

Preferably, the plurality of memory banks is arranged in a stacked structure.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the accompanying drawings. The following preferred embodiments are exemplified for the purpose of explaining the principle of the present invention, without limiting the claims of the present invention.

Figure 1:
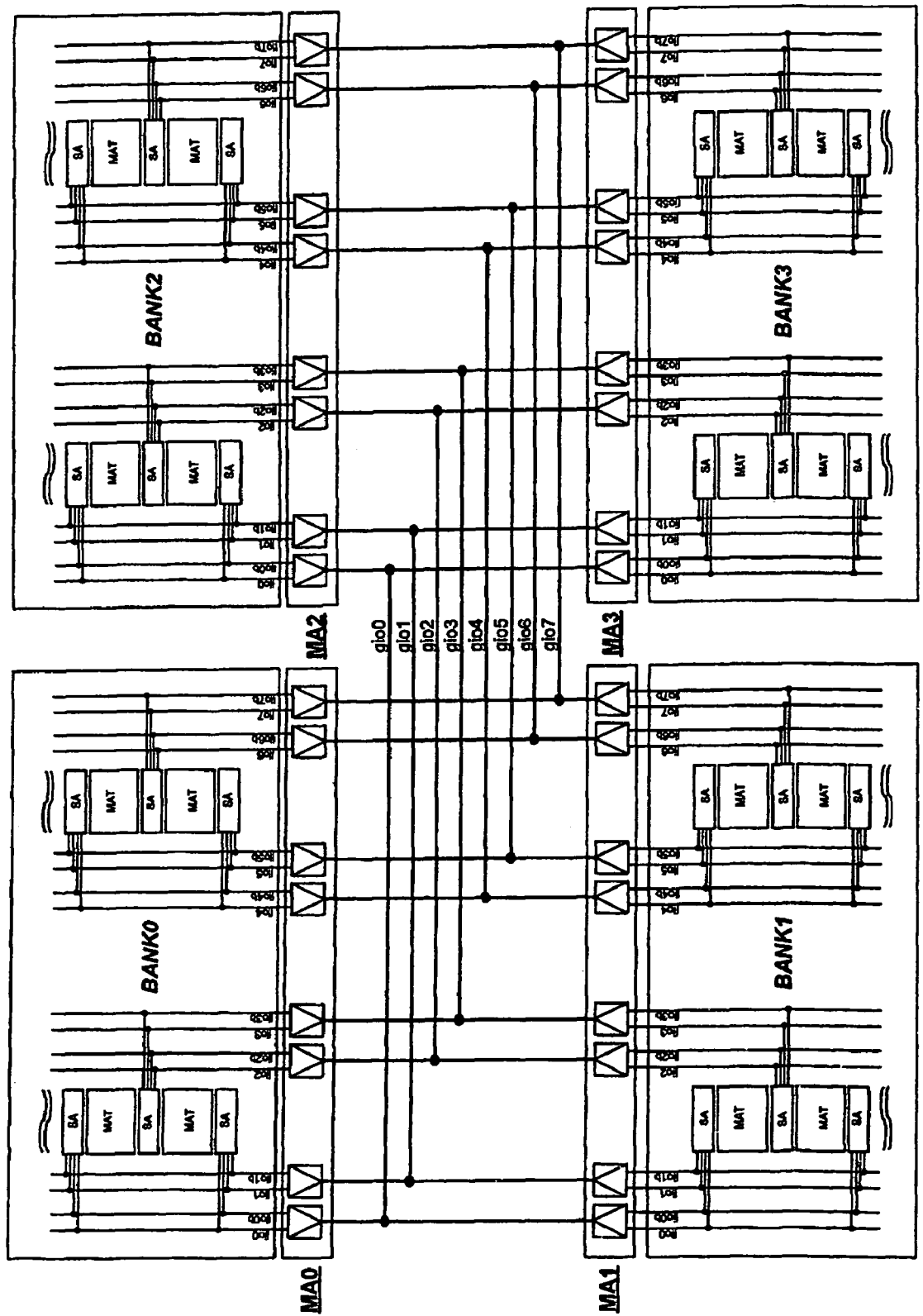
FIG. 1 is a diagram illustrating the configuration of a conventional semiconductor device.
Figure 2:
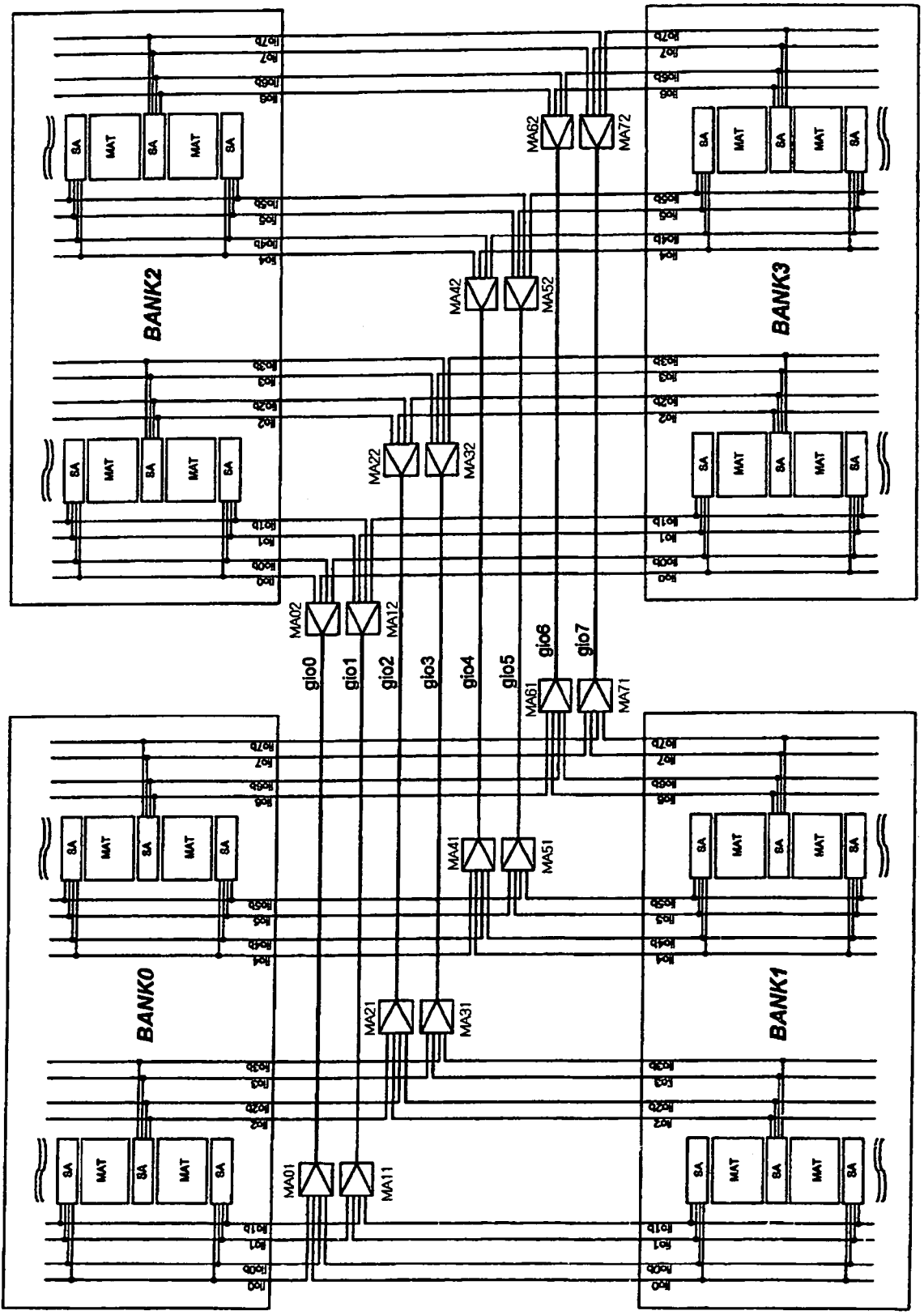
FIG. 2 is a diagram illustrating the configuration of a semiconductor device according to an embodiment of the present invention.
Figure 3:
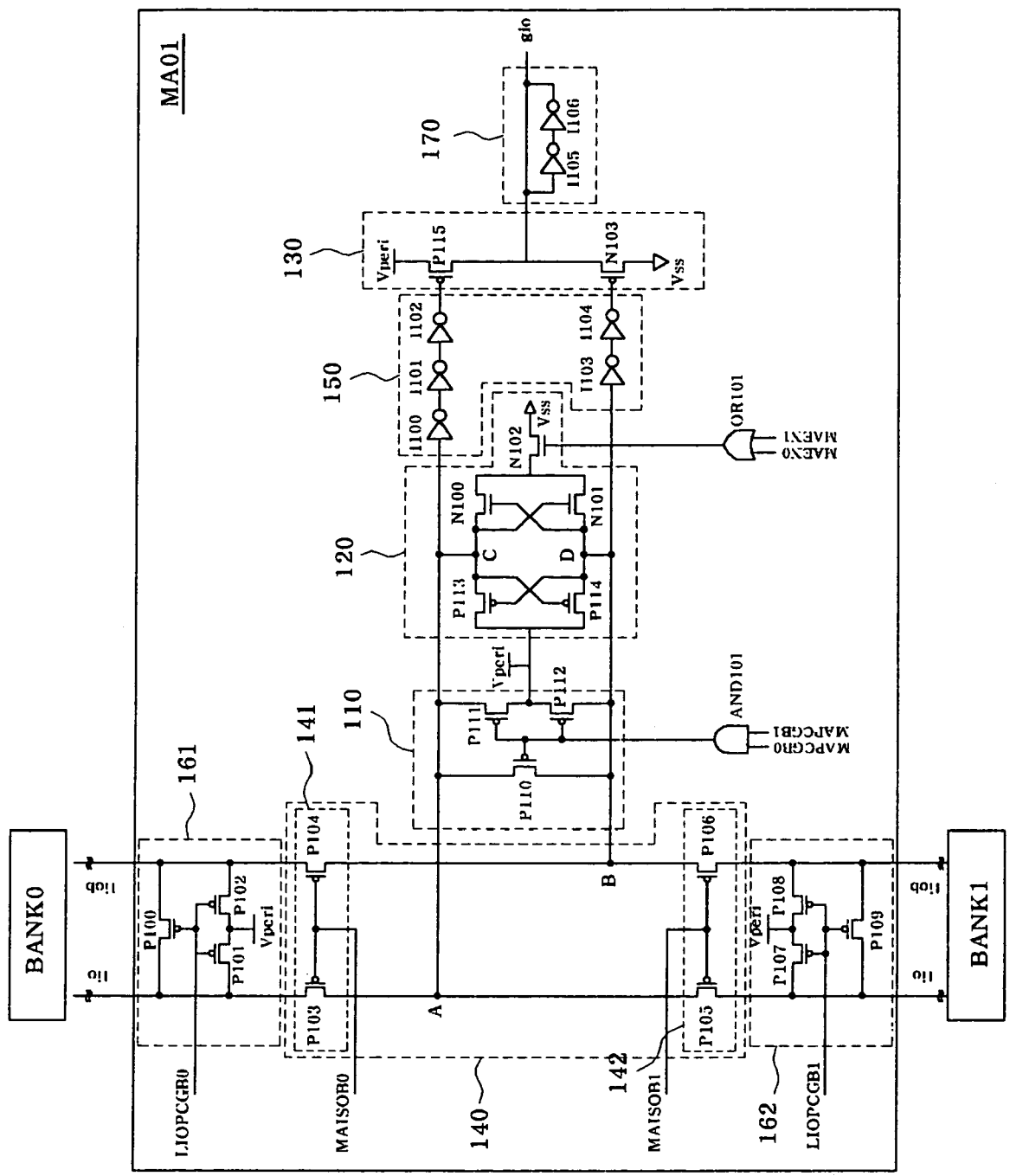
FIG. 3 is a diagram illustrating the configuration of a main amplifier according to an embodiment of the present invention.

FIG. 2 is a diagram illustrating the configuration of a semiconductor device according to an embodiment of the present invention. FIG. 3 is a diagram illustrating the configuration of a main amplifier used for a semiconductor device of the present invention.

As shown in FIG. 3, a main amplifier of the present invention is arranged between a plurality of pairs of local input/output lines lio and liob and a global input/output line gio. The main amplifier comprises a main amplifier pre-charge unit 110 for pre-charging the main amplifier in response to inputted pre-charge control signals MAPCGB0 and MAPCGB1; an input/output sense amplifier 120 enabled by enable signals MAEN0 and MAEN1 for sensing a first data signal transmitted from the plurality of pairs of input/output lines lio and liob of a plurality of memory banks BANK0 and BANK1, amplifying the sensed first data signal, and outputting the amplified first data signal as a second data signal of a first potential level Vperi; and an input/output driver 130 for pull-down or pull-up driving the global input/output line gio in response to the second data signal from the input/output sense amplifier 120, wherein the main amplifier is connected in common to the plurality of pairs of local input/output lines for taking charge of the plurality of memory banks BANK0 and BANK1.

The main amplifier further comprises a main amplifier isolation unit 140 for isolating the plurality of memory banks BANK0 and BANK1 from the main amplifier in response to main amplifier isolation signals. In addition, the main amplifier further comprises an inverter pre-driver 150 for inverting or non-inverting the second data signal from the input/output sense amplifier 120 and providing the inverted or non-inverted second data signal to the input/output driver 130.

As shown in FIGS. 2 and 3, a semiconductor device of the present invention comprises a plurality of memory banks BANK0, . . . , BANK3 each including a plurality of cell matrixes MAT and a plurality of sense amplifier arrays SA; a plurality of local input/output line pre-charge units 161, 162, . . . for pre-charging a plurality of pairs of local input/output lines lio and liob of the plurality of memory banks; and a plurality of main amplifiers MA01, MA02, MA11, MA12, . . . , MA71, and MA72 for amplifying data signals from respective pairs of local input/output lines and outputting the amplified data signals to a plurality of global input/output lines gio0, gio1, . . . , wherein each of the plurality of main amplifiers comprises a main amplifier pre-charge unit 110 for pre-charging the main amplifier in response to inputted pre-charge control signals; an input/output sense amplifier 120 enabled by enable signals for sensing a first data signal transmitted from respective pairs of input/output lines lio and liob of respective memory banks, amplifying the sensed first data signal, and outputting the amplified first data signal as a second data signal of a first potential level Vperi; and an input/output driver 130 for full-down or full-up driving the global input/output line giob in response to the second data signal from the input/output sense amplifier, and wherein each of the plurality of main amplifiers MA01, MA02, MA11, MA12, . . . , MA71, and MA72 is connected in common to respective pairs of local input/output lines lio and liob for taking charge of respective memory banks BANK0, . . . , BANK3).

The main amplifier further comprises a main amplifier isolation unit 140 for isolating the respective memory banks from the main amplifier in response to main amplifier isolation signals. In addition, the main amplifier further comprises an inverter pre-driver 150 for inverting or non-inverting the second data signal from the input/output sense amplifier 120 and providing the inverted or non-inverted second data signal to the input/output driver 130.

Now, operation of the main amplifier and the semiconductor device according to this embodiment of the present invention will be described in detail.

The semiconductor device of this embodiment includes four memory banks BANK0, . . . , BANK3 and is an x8 device having 8 local input/output lines.

Referring to FIG. 2, first, when a read operation is performed, data stored in each cell in a cell matrix MAT of each memory bank BANK0, . . . , BANK3 is amplified by sense amplifiers in a sense amplifier array SA, loaded on respective local input/output lines lio0, lio0b, lio1, lio1b, . . . , lio7, and lio7b, amplified by main amplifiers MA01, MA02, . . . , MA71, and MA72, and transmitted to a DQ block through global input/output lines gio0, gio1, . . . , gio7.

With reference to FIG. 3, the configuration of a main amplifier and its operation in which data loaded on the local input/output lines lio0 and lio0b is amplified by the main amplifier and transmitted through the global input/output lines gio0 will be described in detail.

FIG. 3 shows the configuration of the main amplifier for amplifying data inputted from the local input/output lines lio and liob from two adjacent memory banks BANK0 and BANK1. First, for a read operation of data from the memory bank BANK0, data stored in each cell of the memory bank BANK0 is amplified by the sense amplifier SA shown in FIG. 2 and is loaded on the local input/output lines lio and liob. At this time, if a main amplifier isolation signal MAISOB0 applied to a main amplifier isolation device 141 has a low level, PMOS transistors P103 and P104 are turned on, and accordingly, the data is loaded on nodes A and B. If the main amplifier isolation signal MAISOB0 has a high level, the PMOS transistors P103 and P104 are turned off, and accordingly, the memory bank BANK0 is isolated from the main bank. Similarly, isolation of the memory bank BANK1 from the main amplifier is determined by a main amplifier isolation device 142 to which a main amplifier isolation signal MAISOB1 is applied.

While the read operation of data from the memory bank BANK0 is being performed, the memory bank BANK1 is isolated from the main amplifier by the main amplifier isolation signal MAISOB1 with the high level applied to the main amplifier isolation device 142 so that collision between the data from the memory bank BANK0 and that from the memory bank BANK1 can be avoided. At this time, the local input/output lines of the memory bank BANK1 are pre-charged by a local input/output line pre-charge unit 162 in response to a pre-charge signal LI0PCGB1 having a low level. While the read operation of data from the memory bank BANK1 is being performed, the memory bank BANK0 is isolated from the main amplifier in the same way as described above, and the local input/output lines of the memory bank BANK0 are pre-charged by a local input/output line pre-charge unit 161.

Subsequently, the data loaded on the nodes A and B is amplified to a first potential Vperi by the input/output sense amplifier 120 enabled by enable signals MAEN0 and MAEN1. More specifically, while the read operation of data from the memory bank BANK0 is being performed, the enable signal MAEN0 applied to one input of an OR gate OR402 goes into a high level to turn on an NMOS transistor N102, thus enabling the input/output sense amplifier 120. At this time, if the node A has a high level potential and the node B has a low level potential, an NMOS transistor N 101 with its gate electrode to which a high level signal is applied is turned on to pull-down the node D, and a PMOS transistor P113 with its gate electrode to which a low level signal is applied is turned on to pull-up the node C. Accordingly, the node C is pulled-up to the first potential Vperi and the node D is pulled-down to a ground level. On the contrary, if the node A has a low level potential and the node B has a high level potential, a PMOS transistor P114 with its gate electrode to which a low level signal is applied is turned on to pull-up the node D, and an NMOS transistor N100 with its gate electrode to which a high level signal is applied is turned on to pull-down the node C. Accordingly, the node D is pulled-up to the first potential Vperi and the node C is pulled-down to the ground level.

On the other hand, while the read operation of data is not being performed, the enable signals MAEN0 and MAEN1 go into a low level, and accordingly, the NMOS transistor N102 is turned off to stop the input/output sense amplifier 120. At this time, when any one of the pre-charge control signals MAPCGB0 and MAPCGB1 has a low level, the main amplifier pre-charge unit 110 pre-charges the main amplifier. More specifically, when any one of the pre-charge control signals MAPCGB0 and MAPCGB1 having a low level is applied to an AND gate AND101, a signal having a low level is applied to gate electrodes of PMOS transistors P110, P111 and P112, all of which are then turned on to pre-charge the main amplifier.

Next, the data loaded on the nodes C and D and amplified by the input/output sense amplifier 120 is inverted or non-inverted by inverters I100, . . . , I104 of the inverter pre-driver 150. Then, the inverted or non-inverted data is inputted to the input/output driver 130 to pull-up or pull-down the global input/output line gio. More specifically, when the data loaded on the nodes C and D and amplified by the input/output sense amplifier 120 has high and low levels, respectively, a PMOS transistor P115 of the input/output driver 130 to which a low level signal is applied through the inverters I100, I101 and I102 is turned on, and an NMOS transistor N103 to which a low level signal is applied through the inverters I103 and I104 is turned off. Accordingly, the global input/output line gio is pulled-up to transmit a high level signal. On the contrary, when the data loaded on the nodes C and D has low and high levels, respectively, the PMOS transistor P115 of the input/output driver 130 is turned off, and the NMOS transistor N103 of the input/output driver 130 is turned on. Accordingly, the global input/output line gio is pulled-down to transmit a low level signal. In FIG. 3, a latch unit 170 latches the data loaded on the global input/output line gio for maintaining the level of the data.

As described above, in this embodiment, by connecting the main amplifier to two pairs of local input/output lines of the memory bank BANK0 and the memory bank BANK1, the main amplifier takes charge of the two pairs of local input/output lines. Accordingly, for the x8 device having 4 memory banks and 8 input/output lines, the conventional semiconductor device where one main memory takes charge of one pair of local input/output lines of one memory bank requires 32 main amplifiers. However, the semiconductor device according to this embodiment of the present invention requires 16 main amplifiers, thus cutting the number of main amplifiers in half, which greatly contributes to miniaturization and high integration of the semiconductor device.

Figure 4:
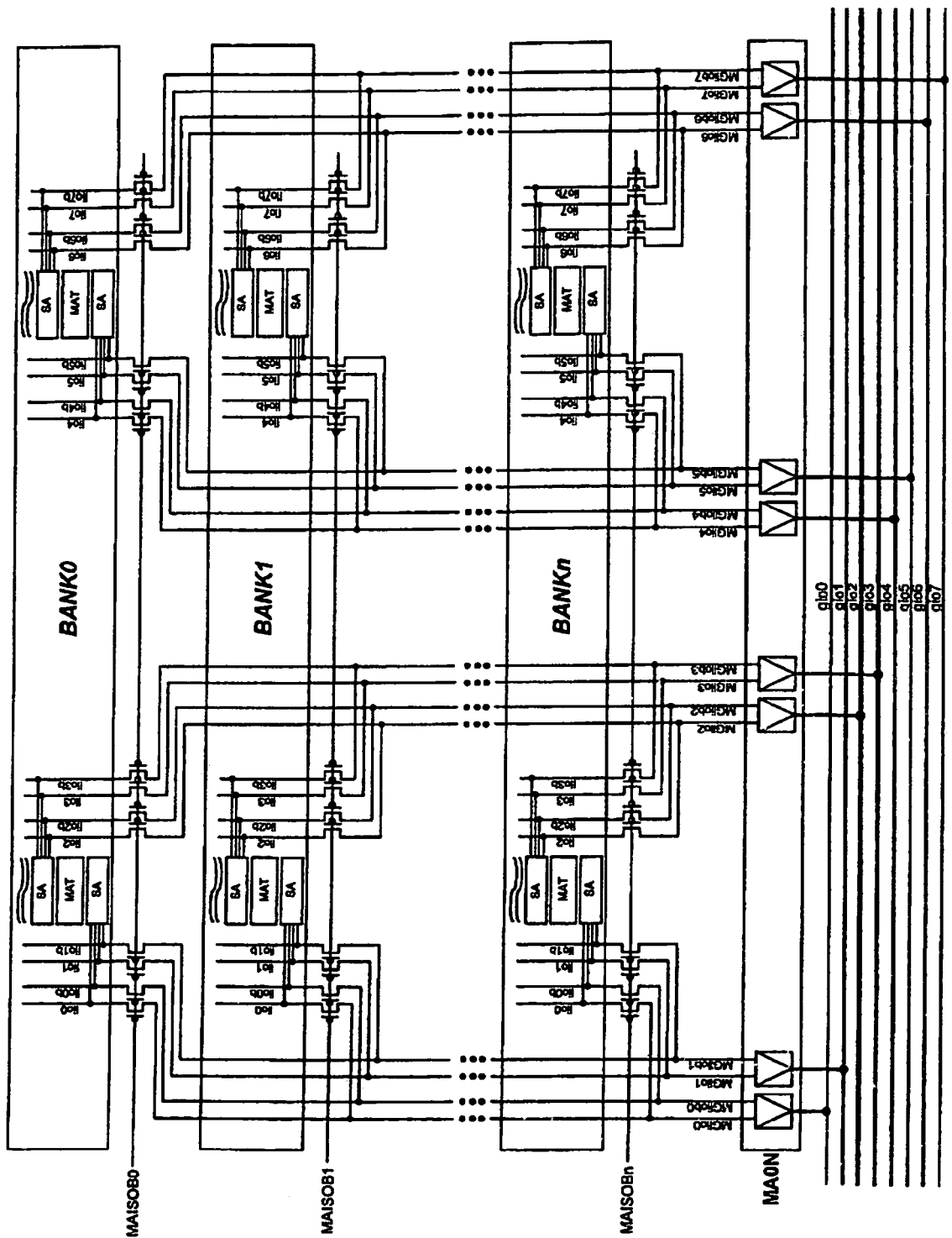
FIG. 4 is a diagram illustrating the configuration of a main amplifier according to another embodiment of the present invention.
Figure 5:
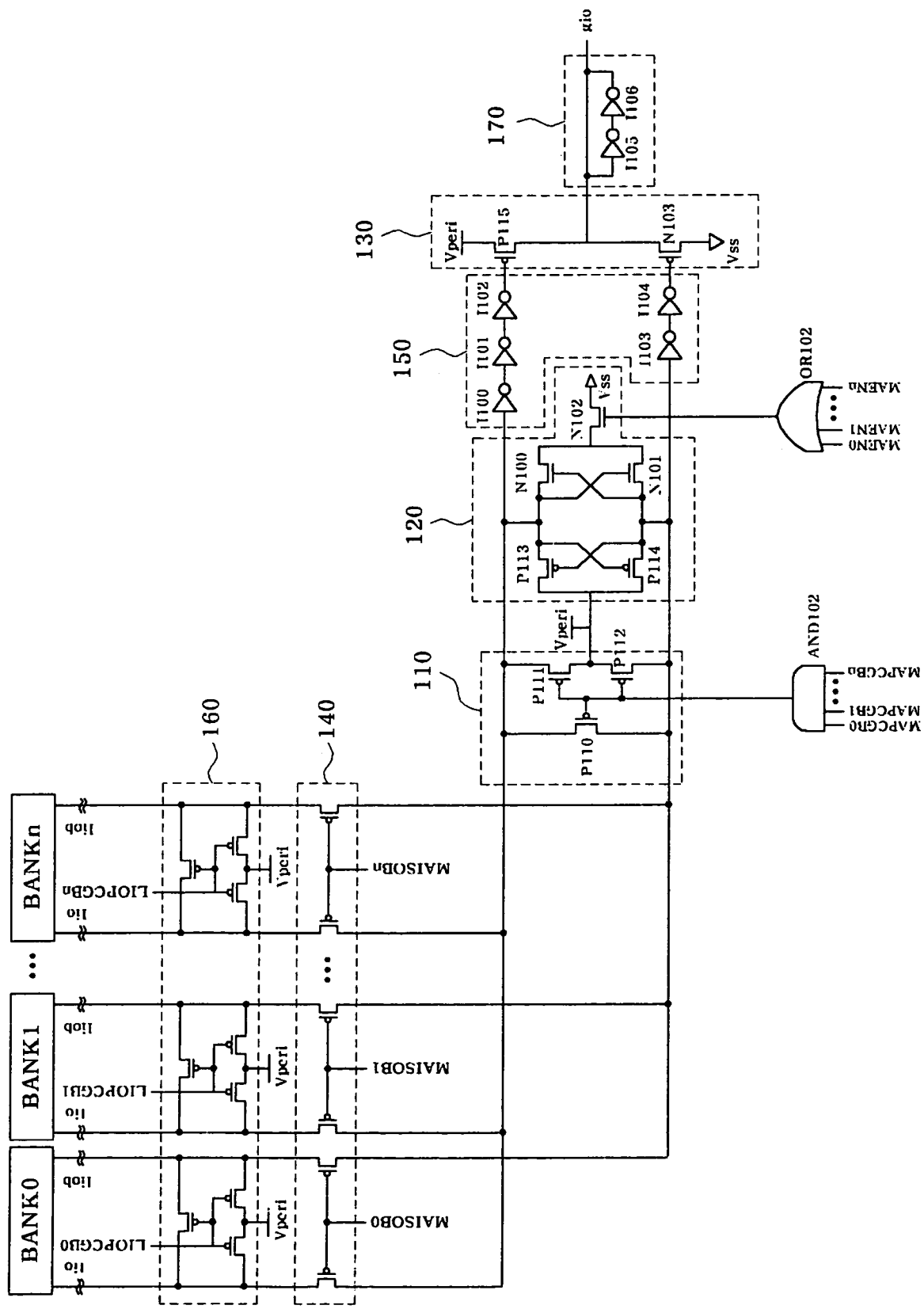
FIG. 5 is a diagram illustrating the configuration of a main amplifier according to yet another embodiment of the present invention.

In addition, while the case where the number of memory banks is 4 and the main amplifier is connected in common to the two pairs of local input/output lines has been described in the above embodiment, the main amplifier can be connected in common to two or more pairs of local input/output lines in a semiconductor device employing four or more memory banks, thus reducing the required number of main amplifiers to less than half of the number of main amplifiers required for the conventional semiconductor device, which is more effective than the above embodiment. FIGS. 4 and 5 are diagrams illustrating other embodiments wherein the main amplifier is connected in common to two pairs of local input/output lines.

Particularly, these embodiments as shown in FIGS. 4 and 5 have a structure where memory banks are stacked and one main amplifier is connected in common to pairs of local input/output lines of n memory banks. Each main amplifier can be isolated from each memory bank by respective main amplifier isolation control signals MAISOB0, MAISOB1, . . . , MAISOBn, which are applied to the main amplifier isolation unit 140, or can read data from each memory bank. After each main amplifier receives the data from one memory bank, it can amplify the received data for transmission to global input/output lines, in the same way as in the embodiment shown in FIGS. 2 and 3. Among other things, the embodiments shown in FIGS. 4 and 5 require that the number of main amplifiers be reduced to 1/n of the number of main amplifiers required for the conventional semiconductor device, which further contributes to miniaturization and high integration of the semiconductor device.

As described above, according to the present invention, by connecting the main amplifier in common to a plurality of pairs of local input/output lines of a plurality of memory banks to receive data stored in cells of memory banks through the plurality of pairs of local input/output lines and amplify the received data for transmission to global input/output lines, one main amplifier takes charge of the plurality of pairs of input/output lines. Accordingly, in the main amplifier and the semiconductor device employing the same according to the present invention, the number of main amplifiers can be significantly reduced. This allows miniaturization and high integration of the semiconductor device, and particularly, can overcome restrictive factors related to a layout pitch in a memory device having a multi local input/output line structure. In addition, according to the present invention, memory chip area can be effectively reduced, thus increasing net dies, which contributes to increase in productivity of semiconductor devices.

The main amplifier and the semiconductor device employing the same, as described above, are also applicable to schemes where global input/output lines are shared when data is inputted/outputted.

As apparent from the above description, according to the present invention, by connecting one main amplifier in common to a plurality of pairs of local input/output lines of at least two memory banks to amplify data signals from the plurality of pairs of local input/output lines and output the amplified data signals to global input/output lines, the number of main amplifiers can be significantly reduced. This allows miniaturization and high integration of the semiconductor device, and particularly, can eliminate restrictive factors related to layout pitch in a memory device having a multi local input/output line structure. In addition, according to the present invention, memory chip area can be effectively reduced, thus increasing net dies, which contributes to an increase in productivity of semiconductor devices.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A main amplifier arranged between a plurality of pairs of local input/output lines and a global input/output line, comprising:
    a main amplifier pre-charge unit for pre-charging the main amplifier in response to inputted pre-charge control signals;
    an input/output sense amplifier enabled by enable signals for sensing a first data signal transmitted from the plurality of pairs of input/output lines of a plurality of memory banks, amplifying the sensed first data signal, and outputting the amplified first data signal as a second data signal of a first potential level; and
    an input/output driver for pull-down or pull-up driving the global input/output line in response to the second data signal from the input/output sense amplifier,
    wherein the main amplifier is connected in common to the plurality of pairs of local input/output lines for taking charge of the plurality of memory banks.

2. The main amplifier as set forth in claim 1, further comprising:
    a main amplifier isolation unit for isolating the plurality of memory banks from the main amplifier in response to a main amplifier isolation signal.

3. The main amplifier as set forth in claim 1, further comprising:
    an inverter pre-driver for inverting or non-inverting the second data signal from the input/output sense amplifier and providing the inverted or non-inverted second data signal to the input/output driver.

4. The main amplifier as set forth in claim 1, wherein the input/output sense amplifier includes two pull-up driving devices and two pull-down driving devices, which are cross-coupled.

5. The main amplifier as set forth in claim 1, wherein the plurality of memory banks is two memory banks, which are symmetrically opposite to each other.

6. The main amplifier as set forth in claim 1, wherein the plurality of memory banks is arranged in a stacked structure.

7. A semiconductor device comprising:
    a plurality of memory banks each including a plurality of cell matrixes and a plurality of sense amplifier arrays;
    a plurality of local input/output line pre-charge units for pre-charging a plurality of pairs of local input/output lines of the plurality of memory banks; and
    a plurality of main amplifiers for amplifying data signals from respective pairs of local input/output lines and outputting the amplified data signals to a plurality of global input/output lines,
    wherein each of the plurality of main amplifiers comprises:
    a main amplifier pre-charge unit for pre-charging the main amplifier in response to inputted pre-charge control signals;
    an input/output sense amplifier enabled by enable signals for sensing a first data signal transmitted from respective pairs of input/output lines of respective memory banks, amplifying the sensed first data signal, and outputting the amplified first data signal as a second data signal of a first potential level; and
    an input/output driver for full-down or full-up driving respective global input/output lines in response to the second data signal from the input/output sense amplifier, and
    wherein the main amplifier is connected in common to a plurality of pairs of local input/output lines for taking charge of a plurality of memory banks.

8. The semiconductor device as set forth in claim 7, wherein the main amplifier further comprises a main amplifier isolation unit for isolating the plurality of memory banks from the main amplifier in response to a main amplifier isolation signal.

9. The semiconductor device as set forth in claim 7, wherein the main amplifier further comprises an inverter pre-driver for inverting or non-inverting the second data signal from the input/output sense amplifier and providing the inverted or non-inverted second data signal to the input/output driver.

10. The semiconductor device as set forth in claim 7, wherein the input/output sense amplifier includes two pull-up driving devices and two pull-down driving devices, which are cross-coupled.

11. The semiconductor device as set forth in claim 7, wherein the plurality of memory banks is two memory banks, which are symmetrically opposite to each other.

12. The semiconductor device as set forth in claim 7, wherein the plurality of memory banks is arranged in a stacked structure.

* * * * *